(12) United States Patent
Chae

(10) Patent No.: US 10,460,823 B2
(45) Date of Patent: Oct. 29, 2019

(54) TEST CONTROL CIRCUIT, SEMICONDUCTOR MEMORY APPARATUS AND SEMICONDUCTOR SYSTEM USING THE TEST CONTROL CIRCUIT

(71) Applicant: SK hynix Inc., Icheon-si, Gyeonggi-do (KR)

(72) Inventor: Haeng Seon Chae, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/037,631

(22) Filed: Jul. 17, 2018

(65) Prior Publication Data

US 2019/0198130 A1  Jun. 27, 2019

(30) Foreign Application Priority Data

Dec. 21, 2017 (KR) .......................... 10-2017-0176618

(51) Int. Cl.
| | |
|---|---|
| *G11C 29/12* | (2006.01) |
| *G11C 29/20* | (2006.01) |
| *G11C 29/46* | (2006.01) |
| *G11C 29/56* | (2006.01) |
| *G11C 29/36* | (2006.01) |
| G11C 29/44 | (2006.01) |
| G11C 29/18 | (2006.01) |

(52) U.S. Cl.
CPC .... *G11C 29/12015* (2013.01); *G11C 29/1201* (2013.01); *G11C 29/20* (2013.01); *G11C 29/36* (2013.01); *G11C 29/46* (2013.01); *G11C 29/56016* (2013.01); *G11C 2029/1802* (2013.01); *G11C 2029/4402* (2013.01)

(58) Field of Classification Search
CPC ........ G11C 29/12015; G11C 29/56016; G11C 29/46; G11C 29/1201; G11C 29/36; G11C 29/20; G11C 2029/1802; G11C 2029/4402

See application file for complete search history.

(56) References Cited

U.S. PATENT DOCUMENTS

| | | | |
|---|---|---|---|
| 6,101,129 A * | 8/2000 | Chen ..................... | G11C 16/16 365/185.14 |
| 7,184,340 B2 * | 2/2007 | Lim ...................... | G11C 29/46 365/201 |
| 7,881,136 B2 | 2/2011 | Kim | |
| 9,076,548 B1 * | 7/2015 | Park ........................ | G11C 5/02 |
| 2001/0038565 A1 * | 11/2001 | Matsuzaki ........... | G11O 11/406 365/222 |

(Continued)

FOREIGN PATENT DOCUMENTS

KR  1020150071470 A  6/2015

*Primary Examiner* — Khamdan N. Alrobaie
(74) *Attorney, Agent, or Firm* — William Park & Associates Ltd.

(57) ABSTRACT

A test control circuit includes a test mode generation circuit. The test mode generation circuit may be configured to generate, while in a fast access mode, a fast test mode signal based on information included in one of a plurality of mode signals and a fast set signal. The test mode generation circuit may be configured to generate, while in a normal mode, a normal test mode signal based on information included in two or more mode signals from the plurality of mode signals and a normal set signal.

10 Claims, 8 Drawing Sheets

(56) References Cited

U.S. PATENT DOCUMENTS

2009/0049364 A1\* 2/2009 Jo .................. G06F 11/1072
714/763
2016/0231950 A1\* 8/2016 Kim .................. G06F 3/0659
2019/0170592 A1\* 6/2019 Jeong ................ H03F 3/45475

\* cited by examiner

FIG.2
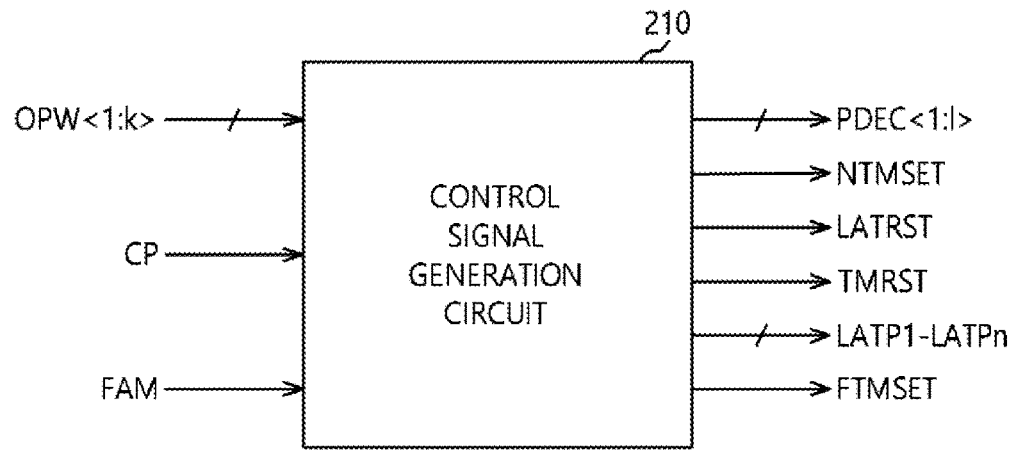
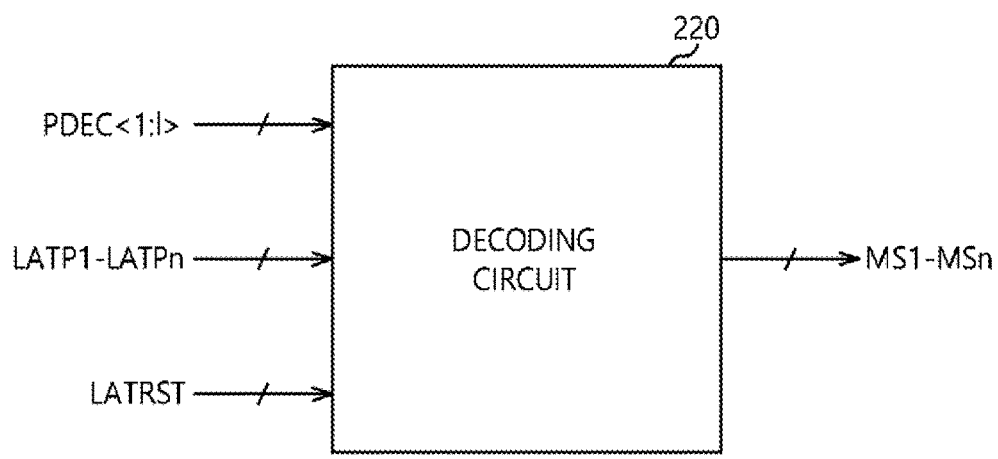
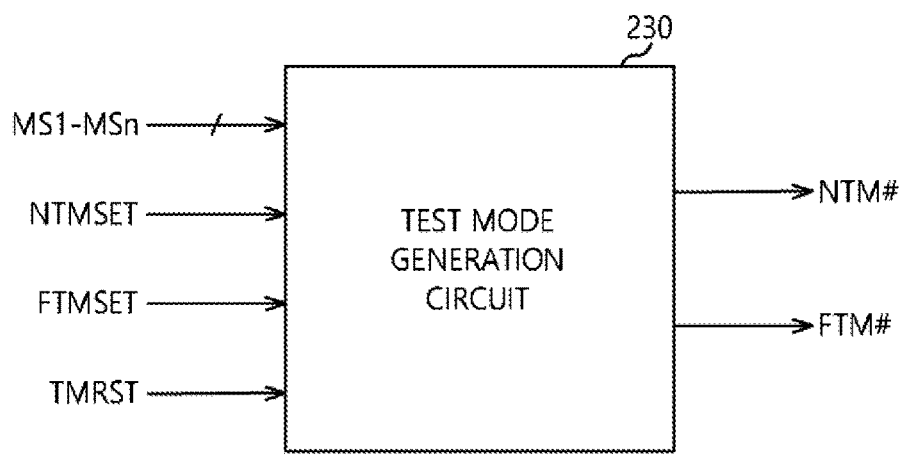

TEST CONTROL CIRCUIT, SEMICONDUCTOR MEMORY APPARATUS AND SEMICONDUCTOR SYSTEM USING THE TEST CONTROL CIRCUIT

CROSS-REFERENCES TO RELATED APPLICATION

The present application claims priority under 35 U.S.C. § 119(a) to Korean application number 10-2017-0176618, filed on Dec. 21, 2017, in the Korean Intellectual Property Office, which is incorporated herein by reference in its entirety as set forth in full.

BACKGROUND

1. Technical Field

Various examples of embodiments may generally relate to a semiconductor technology and, more particularly, to a semiconductor memory apparatus and a test control circuit.

2. Related Art

An electronic device includes a lot of electronic elements, and a computer system includes lots of semiconductor apparatuses comprising a semiconductor. In general, the semiconductor apparatuses of the computer system may include a processor and a memory apparatus. The processor and the memory apparatus may communicate with each other by transmitting and receiving data to and from each other. The processor and the memory apparatus become complex to perform various operations as operation speeds and performances of the semiconductor apparatuses improve.

The memory apparatus may be fabricated through packaging of memory chips formed on wafers. In order to verify the operation performance of the memory apparatus, various tests may be performed to the memory apparatus. The various tests may be performed by an external apparatus such as the processor or an external test device. The memory apparatus may perform various tests in various test modes based on a signal provided from the external apparatus.

SUMMARY

In an embodiment, a test control circuit may be provided. The test control circuit may include a control signal generation circuit configured to generate a normal set signal and a fast set signal based on a test command signal, a command pulse and a fast access signal. The test control circuit may include a decoding circuit configured to generate a plurality of mode signals based on a plurality of the test command signals. The test control circuit may include a test mode generation circuit configured to generate a normal test mode signal based on two or more of mode signals and the normal set signal, and generate a fast test mode signal based on one of mode signal and the fast set signal.

In an embodiment, a test control circuit may be provided. The test control circuit may include a control signal generation circuit configured to generate a normal set signal based on a test command signal in a normal mode, and generate a fast set signal regardless of the test command signal in a fast access mode. The test control circuit may include a test mode generation circuit configured to generate a normal test mode signal based on a mode signal, which is generated on the basis of the test command signal, and the normal set signal in the normal mode, and generate a fast test mode signal based on the mode signal and the fast set signal in the fast access mode.

In an embodiment, a test control circuit may be provided. The test control circuit may include a test mode generation circuit which may be configured to generate, while in a fast access mode, a fast test mode signal based on information included in one of a plurality of mode signals and a fast set signal. The test mode generation circuit may be configured to generate, while in a normal mode, a normal test mode signal based on information included in two or more mode signals from the plurality of mode signals and a normal set signal.

BRIEF DESCRIPTION OF THE DRAWINGS

FIG. 2 is a diagram illustrating a representation of an example of a configuration of a test control circuit in accordance with an embodiment of the present disclosure.

DETAILED DESCRIPTION

Hereinafter, a semiconductor apparatus according to various embodiments will be described below with reference to the accompanying drawings through examples.

Figure 1:
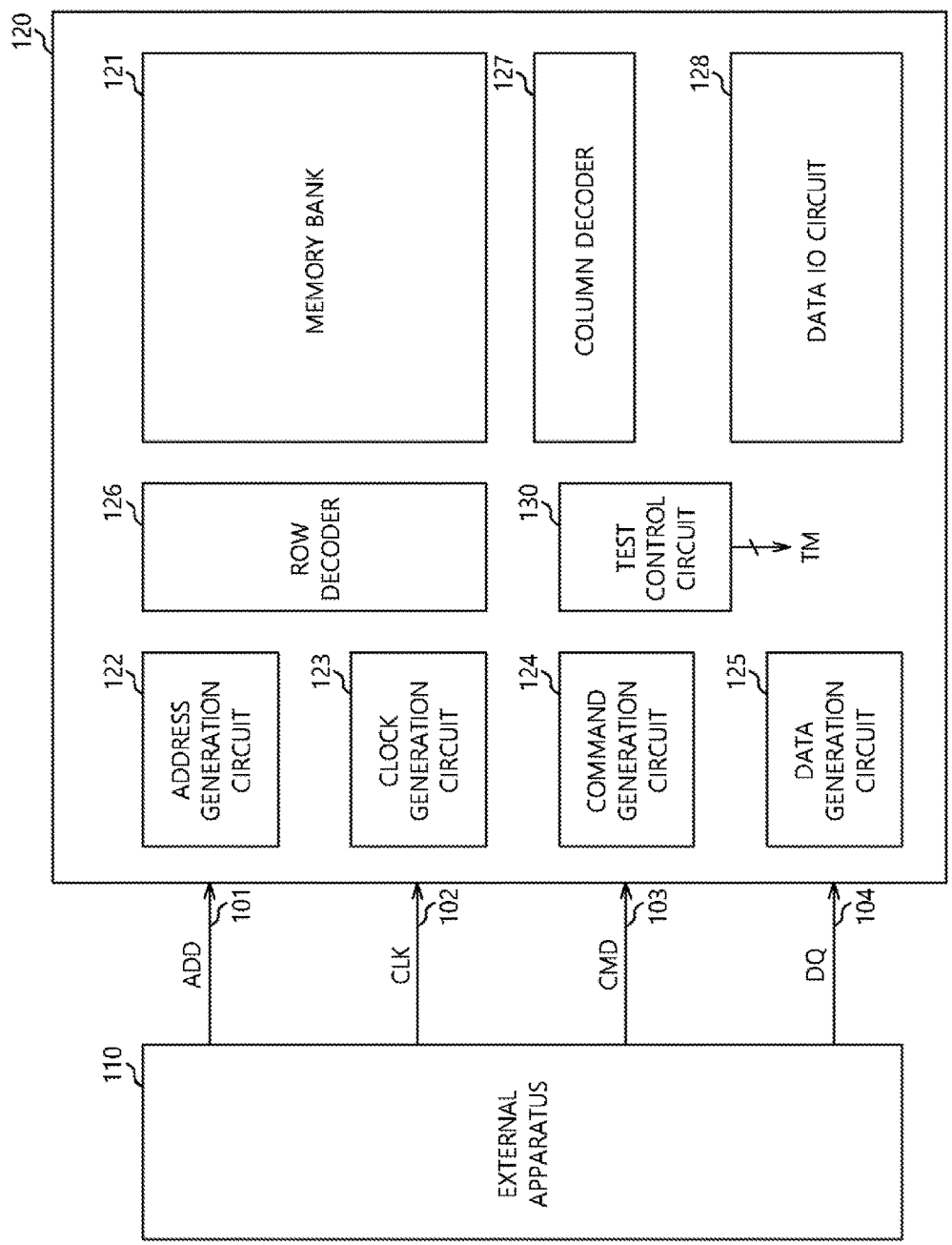
FIG. 1 is a diagram illustrating a representation of an example of a configuration of a semiconductor system in accordance with an embodiment of the present disclosure.

FIG. 1 is a diagram illustrating a representation of an example of a configuration of a semiconductor system 1 in accordance with an embodiment of the present disclosure. Referring to FIG. 1, the semiconductor system 1 may include an external apparatus 110 and a semiconductor memory apparatus 120. The external apparatus 110 and the semiconductor memory apparatus 120 may communicate with each other by transmitting and receiving data to and from each other. In an embodiment, the external apparatus 110 may be a master apparatus of the semiconductor memory apparatus 120 and the semiconductor memory apparatus 120 may be a slave apparatus of the external apparatus 110. The semiconductor memory apparatus 120 may perform various operations under the control of the external apparatus 110. The external apparatus 110 may provide the semiconductor memory apparatus 120 with various control signals required for the semiconductor memory apparatus 120 to perform various operations. The external apparatus 110 may include various kinds of devices. For example, the external apparatus 110 configured to control the semiconductor memory apparatus 120 may be a host apparatus such as the central processing unit (CPU), the graphic processing unit (GPU), the multi-media processor (MMP), the digital signal processor, the application processor (AP) and a memory controller. Further, the external apparatus 110 may be a test apparatus or a test device configured to perform a test operation to the semiconductor memory apparatus 120. The semiconductor memory apparatus 120 may include a volatile memory and a non-volatile memory. The volatile memory may include the static RAM (SRAM), the dynamic RAM (DARM), and the synchronous DRAM (SDRAM). The non-volatile memory may include the read only memory (ROM), the programmable ROM (PROM), the electrically erase and programmable ROM (EEPROM), the electrically programmable ROM (EPROM), the flash memory, the phase change RAM (PRAM), the magnetic RAM (MRAM), the resistive RAM (RRAM), and the ferroelectric RAM (FRAM).

The semiconductor memory apparatus 120 may be electrically coupled to the external apparatus 110 through a plurality of buses. The plurality of buses may be a signal transmission path, a link or a channel configured to transfer a signal. The plurality of buses may include an address bus 101, a clock bus 102, a command bus 103 and a data bus 104. Each of the address bus 101, the clock bus 102 and the command bus 103 may be a unidirectional bus, and the data bus 104 may be a bidirectional bus. The semiconductor memory apparatus 120 may receive an address ADD from the external apparatus 110 through the address bus 101. The semiconductor memory apparatus 120 may receive a clock signal CLK from the external apparatus 110 through the clock bus 102. The semiconductor memory apparatus 120 may receive a command signal CMD from the external apparatus 110 through the command bus 103. The semiconductor memory apparatus 120 may receive data DQ from the external apparatus 110 through the data bus 104. Further, the semiconductor memory apparatus 120 may provide the external apparatus 110 with data DQ through the data bus 104. In an embodiment, the address bus 101 and the command bus 103 may be consolidated into a single command-address bus, and both of the command signal CMD and the data DQ may be transferred through the command-address bus.

The semiconductor memory apparatus 120 may include a memory bank 121, an address generation circuit 122, a clock generation circuit 123, a command generation circuit 124, a data generation circuit 125, a row decoder 126, a column decoder 127 and a data input/output (IO) circuit 128. The memory bank 121 may be a memory cell array including a plurality of memory cells (not illustrated). The memory cell may be configured to store data. The memory bank 121 may include a plurality of word lines (not illustrated) arranged in a row direction, and a plurality of bit lines (not illustrated) arranged in a column direction. The plurality of memory cells may be electrically coupled to the plurality of word lines and a plurality of bit lines at cross points between the plurality of word lines and the plurality of bit lines. The address generation circuit 122 may be electrically coupled to the address bus 101, and may receive an address signal ADD through the address bus 101. The address generation circuit 122 may generate a row address signal and a column address signal by decoding the address signal ADD. The row address signal may be input to the row decoder 126. The row decoder 126 may select a particular word line to be accessed among the plurality of word lines based on the row address signal. The column address signal may be input to the column decoder 127. The column decoder 127 may select a particular bit line to be accessed among the plurality of bit lines based on the column address signal. The clock generation circuit 123 may be electrically coupled to the clock bus 102, and may receive the clock signal CLK through the clock bus 102. The clock generation circuit 123 may generate an internal clock signal to be used within the semiconductor memory apparatus 120 based on the clock signal CLK. The command generation circuit 124 may be electrically coupled to the command bus 103, and may receive the command signal CMD through the command bus 103. The command generation circuit 124 may generate an internal command signal by decoding the command signal CMD. For example, the internal command signal may include an active signal, a write signal, a read signal, a precharge signal, a refresh signal, and so forth. The semiconductor memory apparatus 120 may perform an active operation, a write operation, a read operation, a precharge operation, a refresh operation, and so forth. Also, based on the command signal CMD, the command generation circuit 124 may generate information required for setting various parameters of the semiconductor memory apparatus 120 and may generate a test control signal related to a test operation to the semiconductor memory apparatus 120.

The data generation circuit 125 may be electrically coupled to the data bus 104, and may receive or transmit data DQ through the data bus 104. The data generation circuit 125 may include a receiver configured to receive data DQ through the data bus 104 and a transmitter configured to transmit data DQ through the data bus 104. For example, the data generation circuit 125 may receive data DQ in synchronization with the internal clock signal generated from the clock generation circuit 123, and may transmit data DQ in synchronization with the internal clock signal.

The data IO circuit 128 may receive data DQ from the data generation circuit 125, and may store the received data DQ into an accessed memory cell. The data IO circuit 128 may provide data DQ from an accessed memory cell to the data generation circuit 125 so that data DQ stored in the memory bank 121 of the semiconductor memory apparatus 120 is output to the external apparatus 110.

Referring to FIG. 1, the semiconductor memory apparatus 120 may further include a test control circuit 130. The test control circuit 130 may generate a plurality of test mode signals TM. The semiconductor memory apparatus 120 may enter various test modes based on the plurality of test mode signals. In the various test modes, the semiconductor memory apparatus 120 may perform various test operations. For example, the test control circuit 130 may generate the plurality of test mode signals TM based on the internal command signal generated from the command generation circuit 124.

FIG. 2 is a diagram illustrating a representation of an example of a configuration of a test control circuit 200 in accordance with an embodiment of the present disclosure. The test control circuit 200 may be applied to the semiconductor memory apparatus 120 as the test control circuit 130 described with reference to FIG. 1. The test control circuit 200 may generate various test mode signals based on a test control signal. The test control circuit 200 may generate a normal test mode signal NTM# in a normal mode, and may generate a fast test mode signal FTM# in a fast access mode. The test mode signal may be generated more swiftly in the fast access mode than in the normal mode. The normal mode may be any mode other than the fast access mode. For example, the semiconductor memory apparatus 120 illustrated in FIG. 1 may enter the fast access mode in order to generate a fast test mode signal FTM while performing a test operation. The test control circuit 200 may promptly generate a test mode signal in the fast access mode thereby reducing test time of the semiconductor memory apparatus 120. The test control circuit 200 may variously implement test modes since the test control circuit 200 can generate a test mode signal in a normal mode and a fast access mode.

Referring to FIG. 2, the test control circuit 200 may include a control signal generation circuit 210, a decoding circuit 220 and a test mode generation circuit 230. The control signal generation circuit 210 may receive a test control signal, and may generate a normal set signal NTMSET and a fast set signal FTMSET. The test control signal may include test command signals OPW<1:k> (k is an integer of 2 or greater), a command pulse CP and a fast access signal FAM. The test command signals OPW<1:k> may have a plurality of bits, and may include various information related to the generation of a test mode signal. For example, the test command signals OPW<1:k> having a particular logic value may include information for the generation of the normal set signal NTMSET. Also, the test command signals OPW<1:k> having another particular logic value may include information for the generation of mode signals, which will be described later. The command pulse CP may be enabled each time the test command signals OPW<1:k> is input. The fast access signal FAM may instruct the entry from the normal mode to the fast access mode. The fast access signal FAM may be kept enabled during the fast access mode. The fast access signal FAM may be generated when a particular normal test mode signal NTM# is generated. The fast access signal FAM may also be generated when a particular command signal is input to the semiconductor memory apparatus 120. The control signal generation circuit 210 may generate the normal set signal NTMSET based on the test command signals OPW<1:k> in a normal mode. The control signal generation circuit 210 may generate the fast set signal FTMSET regardless of the test command signals OPW<1:k> in the fast access mode.

The control signal generation circuit 210 may further generate pre-decoding signals PDEC<1:l> (l is an integer of 2 or greater), a latch reset signal LATRST, a plurality of latch pulses LATP<1:n> (n is an integer of 2 or greater) and a test mode reset signal TMRST. The pre-decoding signals PDEC<1:l> may be generated by encoding the test command signals OPW<1:k>. The latch reset signal LATRST may be generated a predetermined amount of time after the normal set signal NTMSET and the fast set signal FTMSET are generated. The predetermined amount of time may be arbitrarily determined. The plurality of latch pulses LATP<1:n> and the test mode reset signal TMRST may be generated on the basis of the pre-decoding signals PDEC<1:l>.

The decoding circuit 220 may generate mode signals based on the test command signals OPW<1:k>. The decoding circuit 220 may generate the plurality of mode signals MS1 to MSn based on the plurality of test command signals OPW<1:k>, which are sequentially received. The decoding circuit 220 may generate the plurality of mode signals MS1 to MSn by receiving the pre-decoding signals PDEC<1:l> and the plurality of latch pulses LATP<1:n>. The decoding circuit 220 may reset the plurality of mode signals MS1 to MSn based on the latch reset signal LATRST.

The test mode generation circuit 230 may generate the normal test mode signal NTM# and the fast test mode signal FTM# by receiving the plurality of mode signals MS1 to MSn, the normal set signal NTMSET and the fast set signal FTMSET. The test mode generation circuit 230 may generate the normal test mode signal NTM# based on two or more of the plurality of mode signals MS1 to MSn and the normal set signal NTMSET in a normal mode. The test mode generation circuit 230 may generate the fast test mode signal FTM# based on one of the plurality of mode signals MS1 to MSn and the fast set signal FTMSET in the fast access mode. In the normal mode, the test mode generation circuit 230 may accumulate information of the two or more of the plurality of mode signals MS1 to MSn and may generate the normal test mode signal NTM# based on the accumulated information when the normal set signal NTMSET is generated. In the fast access mode, the test mode generation circuit 230 may generate the fast test mode signal FTM# by using information included in the one of the plurality of mode signals MS1 to MSn when the fast set signal FTMSET is generated. Therefore, the test mode generation circuit 230 may generate the fast test mode signal FTM# more swiftly than the normal test mode signal NTM# in the fast access mode. The test mode generation circuit 230 may further receive the test mode reset signal TMRST. The test mode generation circuit 230 may reset the normal test mode signal NTM# and the fast test mode signal FTM# based on the test mode reset signal TMRST.

Figure 3:
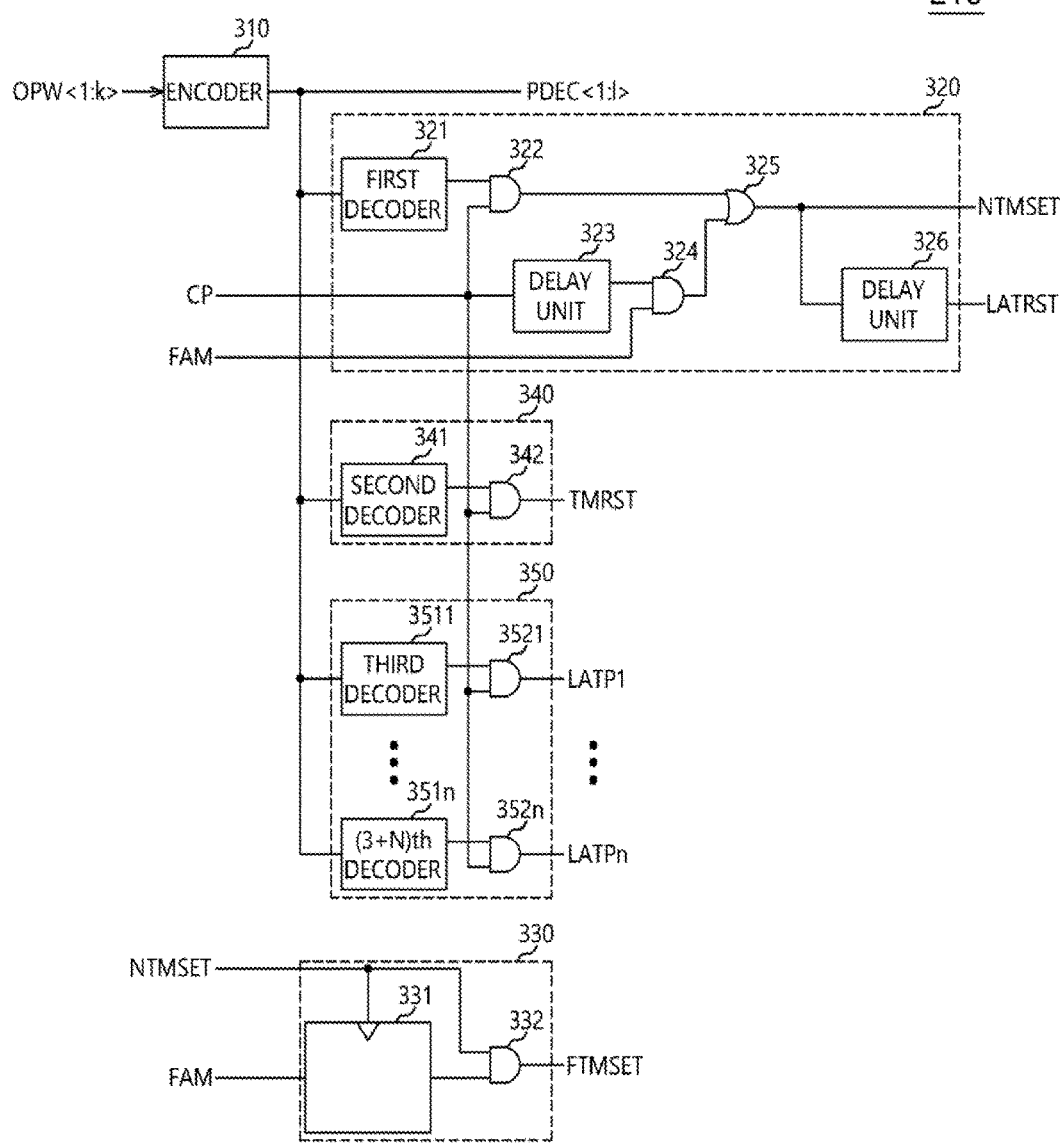
FIG. 3 is a diagram illustrating a representation of an example of a configuration of a control signal generation circuit illustrated in FIG. 2.

FIG. 3 is a diagram illustrating a representation of an example of a configuration of the control signal generation circuit 210 illustrated in FIG. 2. Referring to FIG. 3, the control signal generation circuit 210 may include an encoder 310, a normal set signal generator 320 and a fast set signal generator 330. The encoder 310 may receive the test command signals OPW<1:k> and may generate the pre-decoding signals PDEC<1:l>. For example, the encoder 310 may generate the pre-decoding signals PDEC<1:l> by encoding the test command signals OPW<1:k>. The test command signals OPW<1:k> may have various logic values to include various information. The logic value of the pre-decoding signals PDEC<1:l> may also change according to the logic value of the test command signals OPW<1:k>. In an embodiment, the test control circuit 200 may directly use the test command signals OPW<1:k> rather than using the encoder 310.

The normal set signal generator 320 may receive the pre-decoding signals PDEC<1:l>, the command pulse CP and the fast access signal FAM. The normal set signal generator 320 may include a first decoder 321, a first AND gate 322, a delay unit 323, a second AND gate 324 and an OR gate 325. The first decoder 321 may decode the pre-decoding signals PDEC<1:l>. The first AND gate 322 may receive the output of the first decoder 321 and the command pulse CP. The delay unit 323 may delay the command pulse CP. The amount of delay time may correspond to the amount of delay time occurring in the first decoder 321. The second AND gate 324 may receive the output of the delay unit 323 and the fast access signal FAM. The OR gate 325 may receive the output of the first AND gate 322 and the output of the second AND gate 324, and may output the normal set signal NTMSET.

The first decoder 321 may output a signal having a high level when the test command signals OPW<1:k> and/or the pre-decoding signals PDEC<1:l> include information for enabling the normal set signal NTMSET. The first AND gate 322 may output the command pulse CP when the signal output from the first decoder 321 has a high level. The OR gate 325 may output the command pulse CP, which is output from the first AND gate 322, as the normal set signal NTMSET. The second AND gate 324 may output the command pulse CP as the normal set signal NTMSET when the fast access signal FAM is enabled to have a high level. Therefore, the fast access signal FAM may be disabled to have a low level in the normal mode and the normal set signal generator 320 may generate the normal set signal NTMSET based on the test command signals OPW<1:k> and/or the pre-decoding signals PDEC<1:l> in the normal mode.

The normal set signal generator 320 may generate normal set signal NTMSET regardless of the test command signals OPW<1:k> and the pre-decoding signals PDEC<1:l> in the fast access mode. The normal set signal generator 320 may further include a delay unit 326. The delay unit 326 may generate the latch reset signal LATRST by delaying the normal set signal NTMSET by a predetermined amount of time.

The fast set signal generator 330 may include a flip-flop 331 and a third AND gate 332. The flip-flop 331 may receive the fast access signal FAM at its input node and may receive the normal set signal NTMSET at its clock node. The flip-flop 331 may output the fast access signal FAM when the normal set signal NTMSET is enabled. The third AND gate 332 may receive the output of the flip-flop 331 and the normal set signal NTMSET, and may output the fast set signal FTMSET.

The control signal generation circuit 210 may further include a test mode reset signal generator 340 and a latch pulse generator 350. The test mode reset signal generator 340 may receive the pre-decoding signals PDEC<1:l> and the command pulse CP, and may generate the test mode reset signal TMRST. The test mode reset signal generator 340 may generate the test mode reset signal TMRST based on the test command signals OPW<1:k> and/or the pre-decoding signals PDEC<1:l> when the test command signals OPW<1:k> and/or the pre-decoding signals PDEC<1:l> include information for ending the test mode. The test mode reset signal generator 340 may include a second decoder 341 and a fourth AND gate 342. The second decoder 341 may decode the pre-decoding signals PDEC<1:l>. The fourth AND gate 342 may receive the output of the second decoder 341 and the command pulse CP, and may output the test mode reset signal TMRST. For example, the second decoder 341 may output a signal having a high level and the fourth AND gate 342 may output the command pulse CP as the test mode reset signal TMRST when the test command signals OPW<1:k> and/or the pre-decoding signals PDEC<1:l> include information for ending the test mode.

Figure 4:
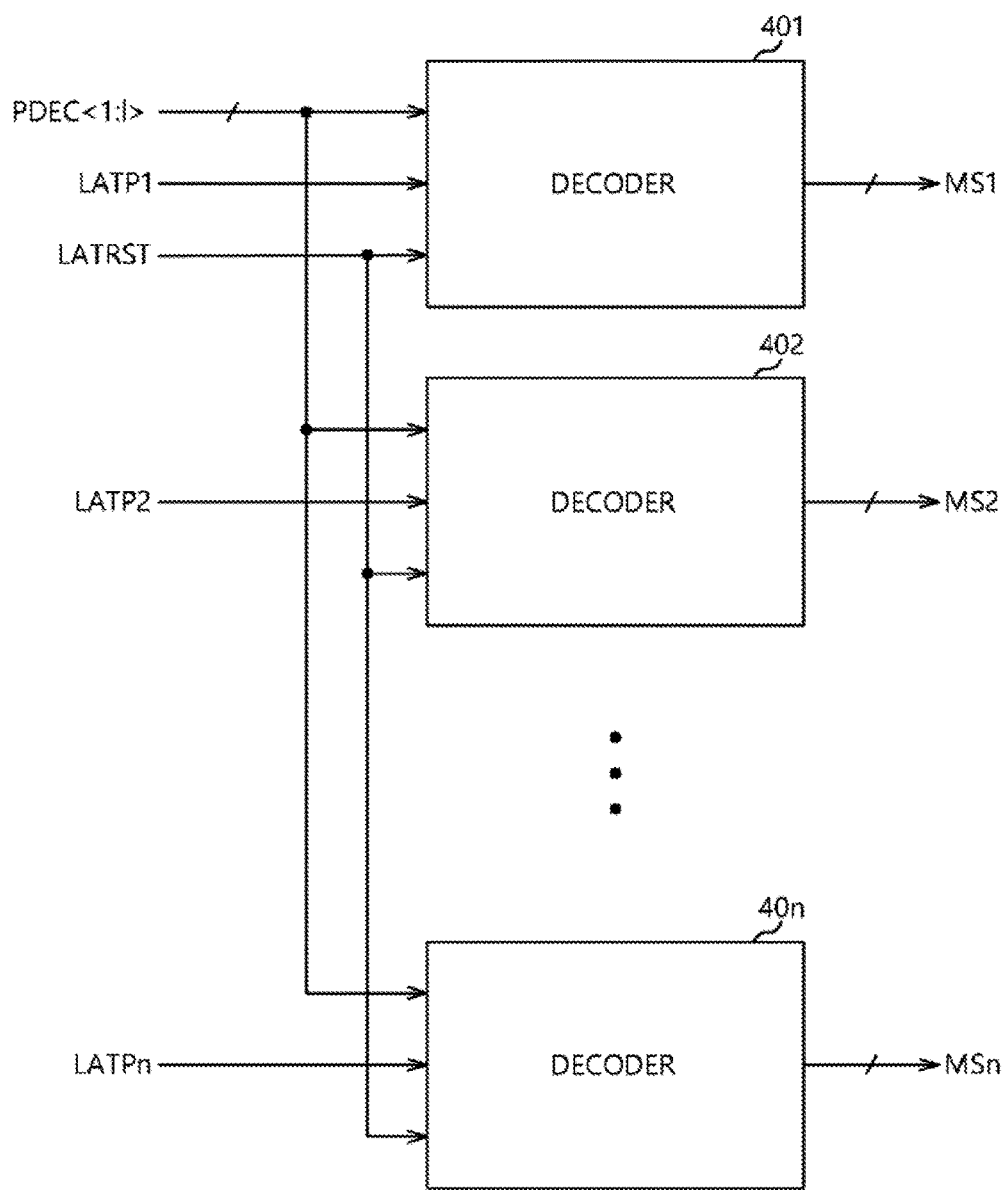
FIG. 4 is a diagram illustrating a representation of an example of a configuration of a decoding circuit illustrated in FIG. 2.

The latch pulse generator 350 may receive the pre-decoding signals PDEC<1:l> and the command pulse CP, and may generate the plurality of latch pulses LATP<1:n>. The latch pulse generator 350 may generate "n" numbers of latch pulses LATP<1:n>, and may include "n" numbers of decoders and "n" numbers of AND gates. The latch pulse generator 350 may include third to (3+n)th decoders 3511, . . . , 351n and fifth to (5+n)th AND gates 3521, . . . , 352n. The third decoder 3511 may decode the pre-decoding signals PDEC<1:l>. The fifth AND gate 3521 may receive the output of the third decoder 3511 and the command pulse CP, and may generate the first latch pulse LATP1. The (3+n)th decoder 351n may decode the pre-decoding signals PDEC<1:l>. The (5+n)th AND gate 352n may receive the output of the (3+n)th decoder 351n and the command pulse CP, and may generate the n-th latch pulse LATPn. The third decoder 3511 may output a signal having a high level when the test command signals OPW<1:k> and/or the pre-decoding signals PDEC<1:l> include information for generating the first mode signal MS1. The fifth AND gate 3521 may output the command pulse CP as the first latch pulse LATP1. The (3+n)th decoder 351n may output a signal having a high level when the test command signals OPW<1:k> and/or the pre-decoding signals PDEC<1:l> include information for generating the n-th mode signal MSn. The (5+n)th AND gate 352n may output the command pulse CP as the n-th latch pulse LATPn FIG. 4 is a diagram illustrating a representation of an example of a configuration of the decoding circuit 220 illustrated in FIG. 2. Referring to FIG. 4, the test control circuit 200 may receive the pre-decoding signals PDEC<1:l> and the plurality of latch pulses LATP<1:n>, and may generate the plurality of mode signals MS1 to MSn. The decoding circuit 220 may reset and/or initialize the plurality of mode signals MS1 to MSn based on the latch reset signal LATRST. The decoding circuit 220 may "n" numbers of decoders. Each of the "n" numbers of decoders may receive the pre-decoding signals PDEC<1:l> and assigned latch pulses LATP<1:n>. The decoding circuit 220 may include first to n-th decoders 401, 402, . . . , 40n. The first decoder 401 may receive the pre-decoding signals PDEC<1:l>, the first latch pulse LATP1 and the latch reset signal LATRST, and may generate the first mode signal MS1. The first decoder 401 may decode the pre-decoding signals PDEC<1:l> and may output the decoded signal as the first mode signal MS1 when the first latch pulse LATP1 is enabled. The first decoder 401 may reset and/or initialize the first mode signal MS1 when the latch reset signal LATRST is enabled. The second decoder 402 may receive the pre-decoding signals PDEC<1:l>, the second latch pulse LATP2 and the latch reset signal LATRST, and may generate the second mode signal MS2. The second decoder 402 may decode the pre-decoding signals PDEC<1:l> and may output the decoded signal as the second mode signal MS2 when the second latch pulse LATP2 is enabled. The second decoder 402 may reset and/or initialize the second mode signal MS2 when the latch reset signal LATRST is enabled. The n-th decoder 402 may receive the pre-decoding signals PDEC<1:l>, the n-th latch pulse LATPn and the latch reset signal LATRST, and may generate the n-th mode signal MSn. The n-th decoder 40n may decode the pre-decoding signals PDEC<1:l> and may output the decoded signal as the n-th mode signal MS2 when the n-th latch pulse LATPn is enabled. The n-th decoder 402 may reset and/or initialize the n-th mode signal MSn when the latch reset signal LATRST is enabled.

Figure 5:
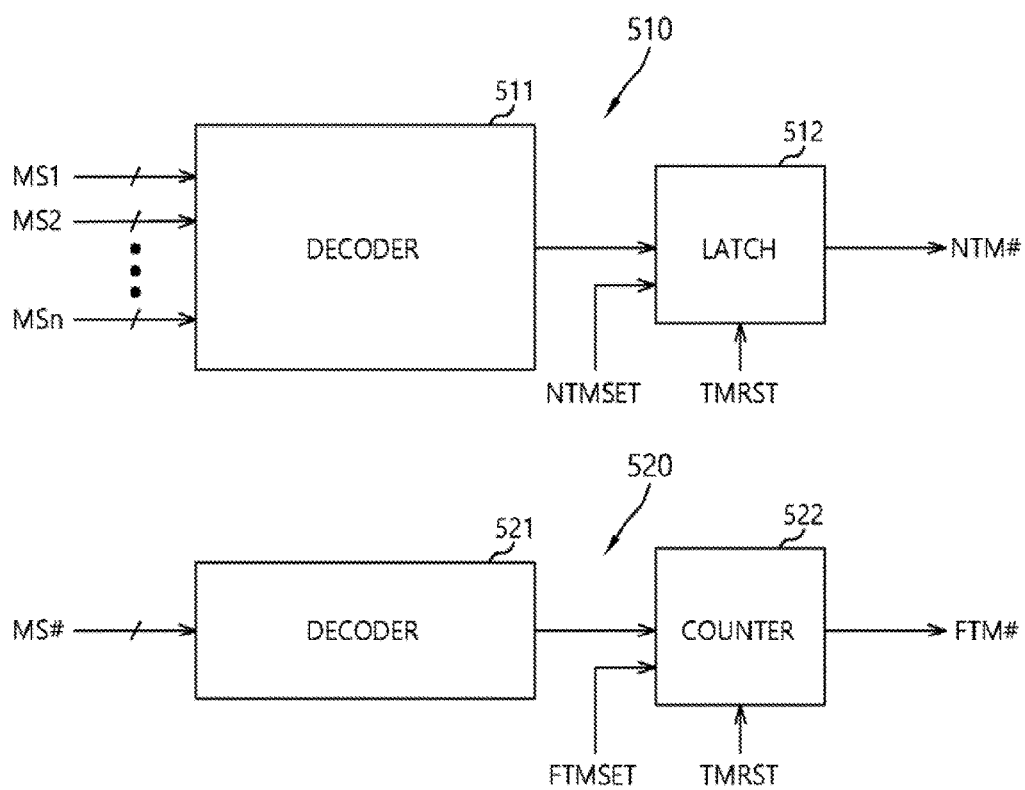
FIG. 5 is a diagram illustrating a representation of an example of a test mode generation circuit illustrated in FIG. 2.

FIG. 5 is a diagram illustrating a representation of an example of the test mode generation circuit 230 illustrated in FIG. 2. Referring to FIG. 5, the test mode generation circuit 230 may include a normal test mode generation circuit 510 and a fast test mode generation circuit 520. The normal test mode generation circuit 510 may generate the normal test mode signal NTM# based on two or more mode signals and the normal set signal NTMSET. The normal test mode generation circuit 510 may include a first decoder 511 and a latch 512. The first decoder 511 may receive the plurality of mode signals MS1 to MSn, and may decode two or more mode signals among the plurality of mode signals MS1 to MSn. The latch 512 may output the output of the first decoder 511 as the normal test mode signal NTM# when the normal set signal NTMSET is enabled. The normal test mode generation circuit 510 may further receive the test mode reset signal TMRST. The latch 512 may reset and/or initialize the normal test mode signal NTM# when the test mode reset signal TMRST is enabled. In an embodiment, the test mode generation circuit 230 may include a plurality of normal test mode generation circuits to generate a plurality of normal test mode signals NTM#. For example, the number of the plurality of normal test mode generation circuits may correspond to the number of the plurality of normal test mode signals NTM# generated from the test mode generation circuit 230.

The fast test mode generation circuit 520 may generate the fast test mode signal FTM# based on one mode signal and the fast set signal FTMSET. The fast test mode generation circuit 520 may include a second decoder 521 and a counter 522. The second decoder 521 may receive and decode one mode signal MS#. The counter 522 may output the output of the second decoder 521 as the fast test mode signal FTM# when the fast set signal FTMSET is enabled. The fast test mode generation circuit 520 may further receive the test mode reset signal TMRST. The counter 522 may reset and/or initialize the fast test mode signal FTM# when the test mode reset signal TMRST is enabled. In an embodiment, the counter 522 may reset and/or initialize the fast test mode signal FTM# when the counter 522 receives the same mode signal as the mode signal received to generate the fast test mode signal FTM#. For example, when the test command signals OPW<1:k> having a particular logic value are provided and a particular mode signal MS# is generated on the basis of the test command signals OPW<1:k>, the counter 522 may generate the fast test mode signal FTM# based on the particular mode signal MS#. After that, when the test command signals OPW<1:k> having the same particular logic values are provided again, the counter 522 may reset and/or initialize the fast test mode signal FTM# based on the particular mode signal MS#. In an embodiment, the test mode generation circuit 230 may include a plurality of fast test mode generation circuits to generate a plurality of fast test mode signals FTM#. For example, the number of the plurality of fast test mode generation circuits may correspond to the number of the plurality of fast test mode signals FTM# generated from the test mode generation circuit 230.

Figure 6:
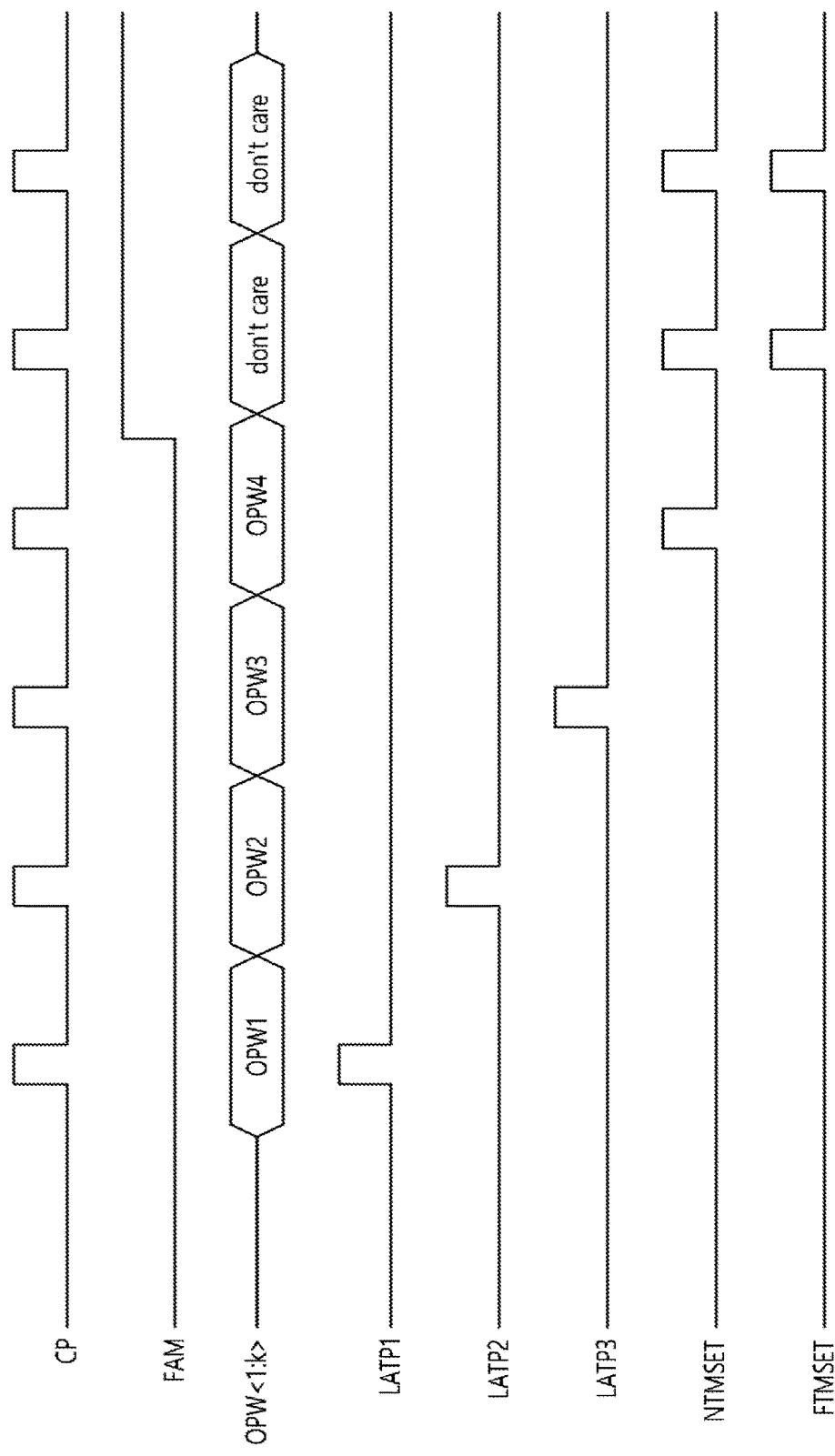
FIG. 6 is a timing diagram illustrating a representation of an example of an operation of the control signal generation circuit illustrated in FIGS. 2 and 3.
Figure 7:
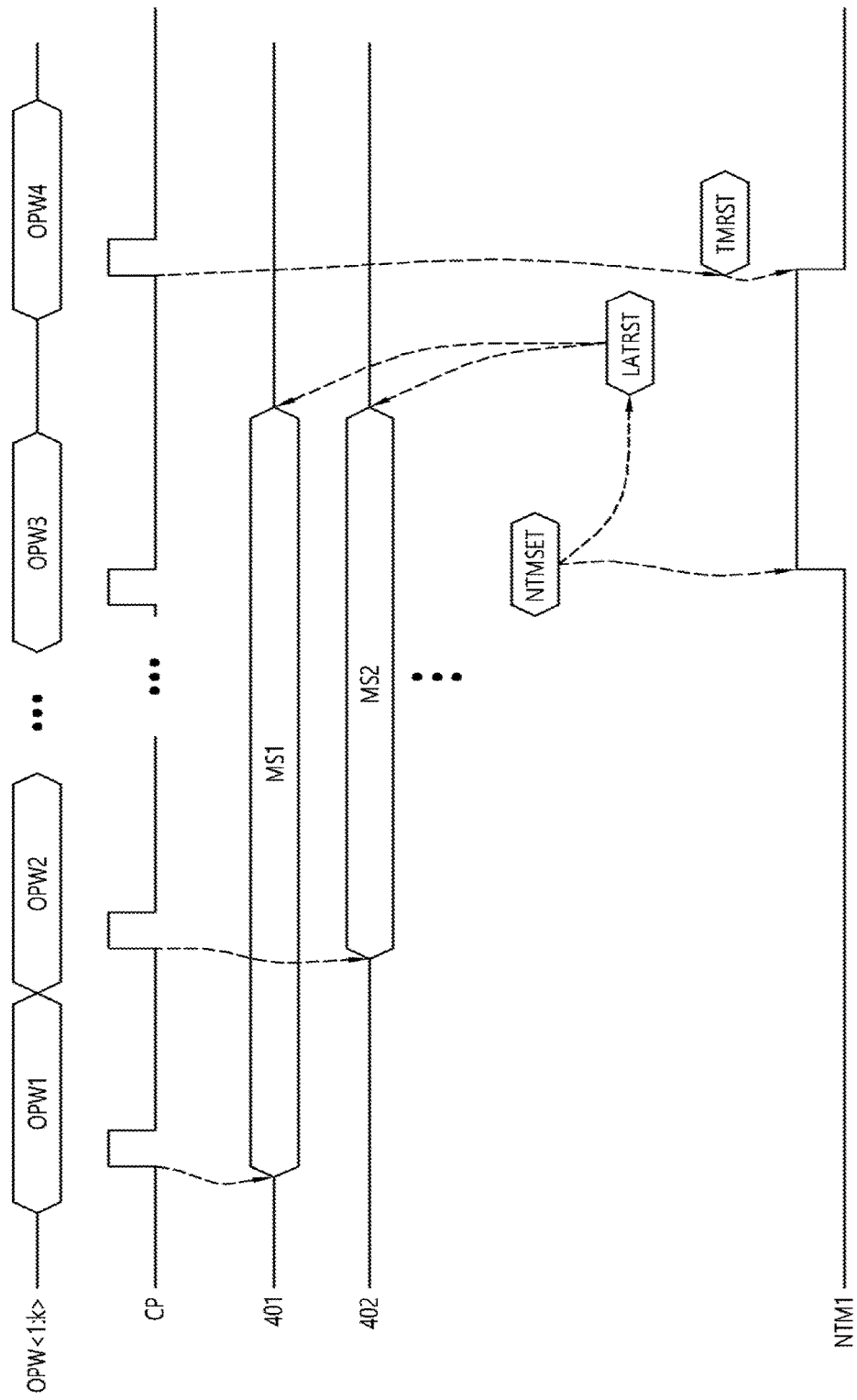
FIG. 7 is a timing diagram illustrating a representation of an example of an operation of the test control circuit in accordance with an embodiment of the present disclosure.
Figure 8:
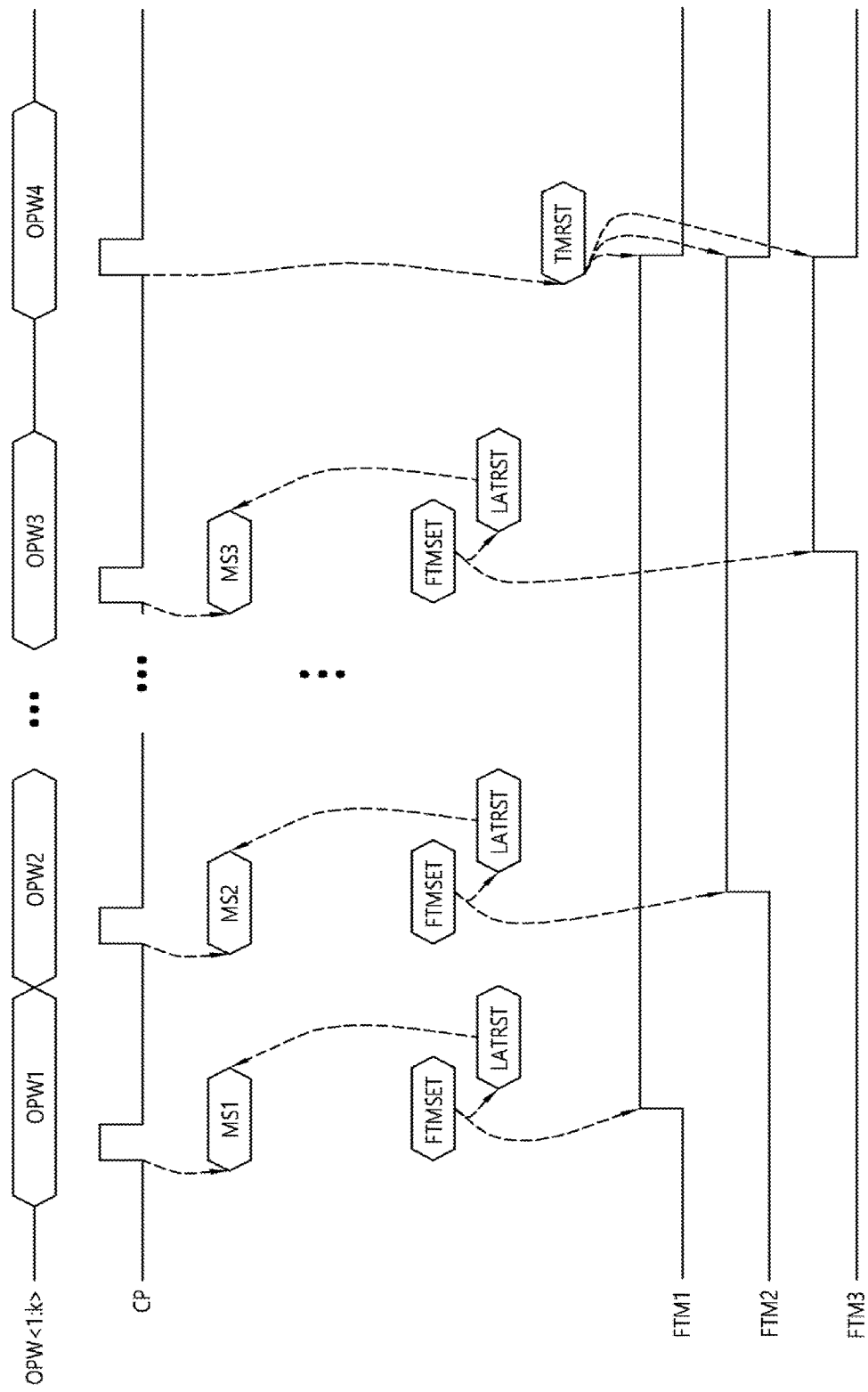
FIG. 8 is a timing diagram illustrating a representation of an example of an operation of the test control circuit in accordance with an embodiment of the present disclosure.

FIGS. 6 to 8 are timing diagrams illustrating a representation of an example of an operation of the test control circuit 200 in accordance with an embodiment of the present disclosure. FIG. 6 is a timing diagram illustrating a representation of an example of an operation of the control signal generation circuit 210 illustrated in FIGS. 2 and 3. Referring to FIG. 6, the command pulse CP may be enabled each time the test command signals OPW<1:k> are received. For example, when the test command signal OPW1 having a first logic value is received, the third decoder 3511 may output a signal having a high level by decoding the pre-decoding signals PDEC<1:l> generated on the basis of the test command signal OPW1. The fifth AND gate 3521 may output the command pulse CP as the first latch pulse LATP1. When the test command signal OPW2 having a second logic value is received, the latch pulse generator 350 may output the command pulse CP as the second latch pulse LATP2. When the test command signal OPW3 having a third logic value is received, the latch pulse generator 350 may output the command pulse CP as the third latch pulse LATP3. For example, the test command signal OPW4 having a fourth logic value may include information to generate the normal set signal NTMSET. The first decoder 321 may output a signal having a high level by decoding the pre-decoding signals PDEC<1:l> generated on the basis of the test command signal OPW4. The first AND gate 322 and the OR gate 325 may output the command pulse CP as the normal set signal NTMSET. After that, when the fast access signal FAM is enabled, the normal set signal generator 320 may output the command pulse CP as the normal set signal NTMSET regardless of the test command signals OPW<1:k> and/or the pre-decoding signals PDEC<1:l> (don't care).

The fast set signal generator 330 may output the normal set signal NTMSET as the fast set signal FTMSET based on the fast access signal FAM. While the fast access signal FAM is enabled, the normal set signal generator 320 and the fast set signal generator 330 may respectively generate the normal set signal NTMSET and the fast set signal FTMSET from the command pulse CP.

FIG. 7 is a timing diagram illustrating a representation of an example of an operation of the test control circuit 200 in accordance with an embodiment of the present disclosure. While the fast access signal FAM is disabled, the test control circuit 200 may operate in a normal mode. The test command signals OPW<1:k> and the command pulse CP may be sequentially and periodically input. When the test command signals OPW<1:k> have a particular logic value, the control signal generation circuit 210 may enable a corresponding latch pulse to generate a mode signal corresponding to the particular logic value. For example, when the test command signal OPW1 having a first logic value is received, the latch pulse generator 350 may enable the first latch pulse LATP1 from the command pulse CP. The first decoder 401 of the decoding circuit 220 may decode the pre-decoding signals PDEC<1:l>, which is generated on the basis of the test command signal OPW1, and may output the decoded signal as the first mode signal MS1 based on the first latch pulse LATP1. For example, when the test command signal OPW2 having a second logic value is received, the latch pulse generator 350 may enable the second latch pulse LATP2 from the command pulse CP. The second decoder 402 of the decoding circuit 220 may decode the pre-decoding signals PDEC<1:l>, which is generated on the basis of the test command signal OPW2, and may output the decoded signal as the second mode signal MS1 based on the second latch pulse LATP2. After that, the test command signals OPW<1:k> having particular logics value may be sequentially received, and the plurality of mode signals MS1 to MSn respectively corresponding to the particular logic values may be sequentially generated.

After that, when the test command signal OPW3 having a third logic value is received, the normal set signal generator 320 may generate the normal set signal NTMSET. The first decoder 511 of the normal test mode generation circuit 510 may decode the first and second mode signals MS1 and MS2 among the plurality of mode signals MS1 to MSn. The latch 512 may output the output of the first decoder 511 as the normal test mode signal NTM1 based on the normal set signal NTMSET. Therefore, the semiconductor memory apparatus 120 may enter a particular test mode and perform a test operation according to the normal test mode signal NTM1. The normal set signal generator 320 may generate the latch reset signal LATRST a predetermined amount of time after the normal set signal NTMSET is generated. The decoding circuit 220 may reset and/or initialize the first and second mode signals MS1 and MS2 based on the latch reset signal LATRST. After that, when the test command signal OPW4 having a fourth logic value is received, the test mode reset signal generator 340 may generate the test mode reset signal TMRST. The latch 512 may reset and/or initialize the normal test mode signal NTM1 based on the test mode reset signal TMRST. Therefore, the normal test mode signal NTM1 may be initialized and a particular test mode according to the normal test mode signal NTM1 may end.

FIG. 8 is a timing diagram illustrating a representation of an example of an operation of the test control circuit 200 in a fast access mode in accordance with an embodiment of the present disclosure. While the fast access signal FAM is enabled, the test control circuit 200 may operate in the fast access mode. The test command signals OPW<1:k> and the command pulse CP may be sequentially and periodically input. For example, when the test command signal OPW1 having a first logic value is received, the latch pulse generator 350 may enable the first latch pulse LATP1 from the command pulse CP. At this time, the control signal generation circuit 210 may generate the fast set signal FTMSET and the normal set signal NTMSET based on the fast access signal FAM regardless of the test command signal OPW1. The decoding circuit 220 may decode the pre-decoding signals PDEC<1:l>, which is generated on the basis of the test command signal OPW1, and may output the decoded signal as the first mode signal MS1 based on the first latch pulse LATP1. The second decoder 521 of the fast test mode generation circuit 520 may decode the first mode signal MS1. The counter 522 may generate fast test mode signal FTM1 from the output of the second decoder 521 based on the fast set signal FTMSET. The semiconductor memory apparatus 120 may enter a first test mode and perform a test operation based on the fast test mode signal FTM1. The control signal generation circuit 210 may generate the latch reset signal LATRST a predetermined amount of time after the normal set signal NTMSET are generated. The decoding circuit 220 may reset and/or initialize the first mode signal MS1 based on the latch reset signal LATRST.

For example, when the test command signals OPW2 and OPW3 having second and third logic values are received, second and third mode signals MS2 and MS3 may be generated. The test mode generation circuit 230 may generate a fast test mode signal FTM2 based on one of the second mode signal MS2 and the fast set signal FTMSET. The test mode generation circuit 230 may generate a fast test mode signal FTM3 based on one of the third mode signal MS3 and the fast set signal FTMSET. The semiconductor memory apparatus 120 may enter second and third test modes and perform test operations based on the fast test mode signals FTM2 and FTM3. When the latch reset signal LATRST is generated a predetermined amount of time after the normal set signal NTMSET and the fast set signal FTMSET are generated, the second and third mode signals MS2 and MS3 may be reset and/or initialized. After that, when the test command signal OPW4 having a fourth logic value is received to end a test mode, the control signal generation circuit 210 may generate the test mode reset signal TMRST. The test mode generation circuit 230 may reset all of the fast test mode signals FTM1, FTM2 and FTM3 based on the test mode reset signal TMRST. Therefore, the first to third test modes may end.

While certain embodiments have been described above, it will be understood to those skilled in the art that the embodiments described are by way of example only. Accordingly, the test control circuit, semiconductor memory apparatus and semiconductor system using the same should not be limited based on the described embodiments.

What is claimed is:

1. A test control circuit comprising:
a control signal generation circuit configured to generate a normal set signal based on a test command signal in a normal mode, and generate a fast set signal regardless of the test command signal in a fast access mode; and
a test mode generation circuit configured to generate a normal test mode signal based on a mode signal, which is generated based on the test command signal, and the normal set signal in the normal mode, and generate a fast test mode signal based on the mode signal and the fast set signal in the fast access mode.

2. The test control circuit of claim 1, wherein the control signal generation circuit includes:
an encoder configured to a pre-decoding signal by encoding the test command signal;
a normal set signal generator configured to generate the normal set signal based on the pre-decoding signal, the command pulse and a fast access signal; and
a fast set signal generator configured to generate the fast set signal based on the normal set signal and the fast access signal.

3. The test control circuit of claim 2, wherein the normal set signal generator is configured to generate the normal set signal based on the pre-decoding signal and the command pulse, or based on the command pulse and the fast access signal.

4. The test control circuit of claim 2, wherein the control signal generation circuit is configured to further generate a latch reset signal by delaying the normal set signal, and further generate a test mode reset signal and a plurality of latch pulses based on the pre-decoding signal and the command pulse.

5. The test control circuit of claim 2, further comprising a decoding circuit configured to generate a plurality of mode signals based on a plurality of the test command signals.

6. The test control circuit of claim 5,
wherein the decoding circuit includes a plurality of decoders configured to generate the plurality of mode signals by decoding the pre-decoding signal based on the plurality of latch pulses, respectively, and
wherein the plurality of decoders are configured to reset the plurality of mode signals based on the latch reset signal, respectively.

7. The test control circuit of claim 5, wherein the test mode generation circuit includes:
a normal test mode generator configured to generate the normal test mode signal based on the plurality of mode signals and the normal set signal, and reset the normal test mode signal based on the test mode reset signal; and
a fast test mode generator configured to generate the fast test mode signal based on one of mode signal and the fast set signal.

8. The test control circuit of claim 7,
wherein the normal test mode generator is configured to generate the normal test mode signal based on two or more of mode signals, and
a fast test mode generator is configured to generate the fast test mode signal based on one of mode signal and the fast set signal.

9. The test control circuit of claim 7, wherein the fast test mode generator is configured to reset the fast test mode signal based on the test mode reset signal.

10. The test control circuit of claim 7, wherein the fast test mode generator is configured to reset the fast test mode signal based on the single mode signal.

* * * * *